United States Patent [19]

Hayashi

[11] Patent Number: 5,241,574
[45] Date of Patent: Aug. 31, 1993

[54] PULSE GENERATING APPARATUS

[75] Inventor: Yoshinori Hayashi, Hyogo, Japan

[73] Assignee: Mitsubishi Denki Kabushiki Kaisha, Tokyo, Japan

[21] Appl. No.: 788,684

[22] Filed: Nov. 6, 1991

[30] Foreign Application Priority Data

Nov. 8, 1990 [JP] Japan .................. 2-303654

[51] Int. Cl.⁵ ............................... G06F 7/02
[52] U.S. Cl. ......................... 377/39; 377/20; 377/54
[58] Field of Search ................. 377/20, 39, 44

[56] References Cited

U.S. PATENT DOCUMENTS

| | | | |
|---|---|---|---|
| 4,222,103 | 9/1980 | Chamberlain | 377/20 |
| 4,339,657 | 7/1982 | Larson et al. | 377/39 |
| 4,873,624 | 10/1989 | Sibigtroth | 377/39 |
| 4,942,559 | 7/1990 | Fleck et al. | 377/44 |
| 5,033,066 | 7/1991 | De Vore | 377/39 |

Primary Examiner—John S. Heyman
Attorney, Agent, or Firm—Townsend and Townsend Khourie and Crew

[57] ABSTRACT

A pulse generating apparatus equipped with a first comparator (20) for comparing the count value of a timer register (9) with the reference value of a comparing register (10) in terms of each bit and a coincidence detection circuit (21) responsive to the output values of the first comparator (20) to output a coincidence signal when all the bits of the output values thereof are the same. Between the first comparator (20) and the coincidence detection circuit (21) there are provided a plural-bit mask register (17) whose comparison value is set by a CPU (2) and a second comparator (22) for comparing the comparison value of the mask register (17) with the output value of the first comparator (20) in terms of each bit. With this arrangement, the generation timing of the output pulse can variously be changed by setting one time the mask register (17).

2 Claims, 3 Drawing Sheets

PULSE GENERATING APPARATUS

BACKGROUND OF THE INVENTION

1. Field of the Invention

The present invention relates to an arrangement of a pulse generating apparatus formed on an integrated circuit.

2. Description of the Prior Art

FIG. 3 shows one example of a microcomputer having therein a so-called output comparing type 8-bit timer circuit such as disclosed in Japanese Patent Laid-Open No. 55-44700. In FIG. 3, numeral 1 represents a microcomputer, 2 designates a CPU encased therein, and 3 is a timer circuit, the CPU 2 and the timer circuit 3 being coupled through a data bus 4 to each other. Further, numeral 5 depicts an oscillation circuit having terminals XIN and XOUT between which a ceramic vibrator 6 and a bias resistor 7 are provided so as to generate a signal having a frequency inherent to the vibrator 6 in association with an amplifier 8 of the microcomputer 1, the signal being supplied to the CPU 2 and the timer circuit 3. In the timer circuit 3 there are provided four registers: a timer register 9, a comparing register 10, a timer control register comprising control registers 11a, 11b, 11c and 11d, and a timer status register 12 which are respectively coupled to the data bus 4. CPU 2 can read the data from the timer control registers 11a to 11d and further into the timer status register 12 and with the timer control register 11a to 11d. In the illustration, the coupling of the timer control register 11 and the timer status register 12 to the data bus 4 is omitted because of being not in direct relation to this invention.

Each bit of the timer register 9 and each bit of the comparing register 10 are compared with each other at each comparing section of a comparator 20 and the comparison results of all the comparing sections thereof are inputted to an 8-bit AND circuit 21 which acts as a coincidence detection circuit. The timer register 9 and comparing register 10 are respectively constructed by shift registers. Each of the comparing sections of the comparator 20 outputs an H (high level) signal only in response to the coincidence between the two inputs, and the 8-bit AND circuit 21 outputs an H signal only when all the inputs are in the high level states.

The timer circuit 3 is responsive to a clock input signal 13 and can be responsive to a signal from the oscillation circuit 5 or a signal from an external input terminal TIN, the switching operation therebetween being effected in accordance with the clock selection bit 11a of the timer register 11. Here, when the clock selection bit 11a is "1", the timer circuit 3 is coupled to the external input terminal TIN side, and when being "0", it is coupled to the oscillation circuit 5 side. Further, with the clock stopping bit 11b of the timer control register 11, the connection to the clock source can be cut through a switch. Here, when the clock stopping bit 11b is "1", the connection is established, and when being "0", the connection is cut. The timer circuit 3 outputs a comparison output signal 14 which can be coupled to an interrupt input of the CPU 2 through a switch controllable in accordance with an interrupt-allowable bit 11c of the timer control register 11. When the interrupt-allowable bit 11c is "1", the coupling is made, and when being "0", the coupling is cut.

The comparison output signal 14 is coupled to an output flag 12 making up the timer status register 12 and further to a toggle flip-flop 15. The output of the toggle flip-flop 15 is coupled through a three-state buffer 16 to an external terminal TOUT, the three-state buffer 16 is directly controllable by an output control bit 11d of the timer control register 11. Here, when the output control register 11d of the timer control register 11 is "1", the output of the toggle flip-flop 15 enters into the ON state, and when it is "0", the output enters into the OFF state, i.e., in the floating state.

Secondly, the operation will be described hereinbelow. The CPU 2 operates in synchronism with a clock supplied from the oscillation circuit 5. In the timer circuit 3, the comparison value is set in response to the CPU 2 writing data into the comparing register 10. Subsequently, an initial value of the timer is set in response to the CPU 2 writing data into the timer register 9.

When the clock selection bit 11a is set to be "0" and the clock stopping bit 11b is set to be "1", a clock input signal 13 is inputted from the oscillation circuit 5 to the timer register 9. The timer circuit 3 starts counting up the clock input signal 13, the count value always appearing at the timer register 9. The value of the timer register 9 is always compared with the value of the comparing register 10 at every bit. In response to the coincidence of all the bits, the comparison output 14 becomes "1". This output variation allows that a) the output flag 12 is set to be "1", b) the interrupt requirement is taken to the CPU 2 with the interrupt-allowable bit 11c being set to "1" and coupled to the CPU 2, and c) due to resulting in the trigger input, the output of the toggle flip-flop 15 is inverted, and in response to the output control bit 11d being set to "1", the output of the toggle flip-flop 15 is outputted through the three-state buffer 16 to the terminal TOUT.

Since the conventional timer circuit is arranged as described above, the comparison output is generated only one time at every period (count value:256) of the timer and hence the output waveform of the terminal TOUT (for example) becomes a square wave to be inverted at every period of the timer. In addition, the interrupt request occurs at every period of the timer.

Here, to change the inverting time of the output waveform with TOUT variously the comparing register 10 should be changed frequently in accordance with a program in response to every output inversion. This requires loading the data to the comparing register 10 with the program execution on the CPU 2. In addition, in the case of generating extremely shortening the interval of the output inversion, there is a further problem that it is impossible to change the comparing register 10 due to the program becomes impossible because of the long execution time of the program on the CPU 2.

SUMMARY OF THE INVENTION

The present invention has been developed in order to remove the above-described problems and contemplates to provide a pulse generating apparatus which is capable of reducing the load of the program execution on the CPU necessary for the timer operation and further generating various waveforms.

According to this invention, a pulse generating apparatus is equipped with a central processing unit (CPU) 2, a plural-bit timer register 9 whose initial value is set by the CPU 2 and which is arranged to count the clock input, a plural-bit comparing register 10 whose reference value is set by the CPU 2, a first comparator 20 for comparing the count value of the timer register 9 with the reference value of the comparing register 10 in terms of each bit, and a coincidence detection circuit 21 responsive to the output value of the first comparator 20 so as to output a coincidence signal when all the output value bits are the same, and further equipped with a plural-bit mask register 17 whose comparison value is set by the CPU 2, and a second comparator 22 for comparing the comparison value of the mask register 17 with the output value of the first comparator 20 in terms of each bit, the mask register 17 and the second comparator 22 being provided between the first comparator 20 and the coincidence detection circuit 21.

Even if in the comparison result between the bit values of the timer register 9 and the comparing register 10 due to the comparator 20 there are one or more non-coincident bit values, the second comparator 22 outputs a signal indicative of the coincidence of all the bits after the non-coincident bits are replaced with the bits of the mask register 17. That is, the comparison between the values of the timer register 9 and the comparing register 10 is performed under the limitation to the bit number designated by the newly provided mask register 17. Since the timer register 9 and the comparing register 10 are compared with each other only with respect to the bits to be designated by the mask register 17, when the timer register 9 and the comparing register 10 partially become coincident with each other so as to obtain the same output in terms of all the bits, the coincidence detection circuit 21 outputs a coincidence pulse.

The above and other objects, features, and advantages of the Invention will become more apparent from the following description when taken in conjunction with the accompanying drawings.

DESCRIPTION OF THE PREFERRED EMBODIMENT

Figure 1:
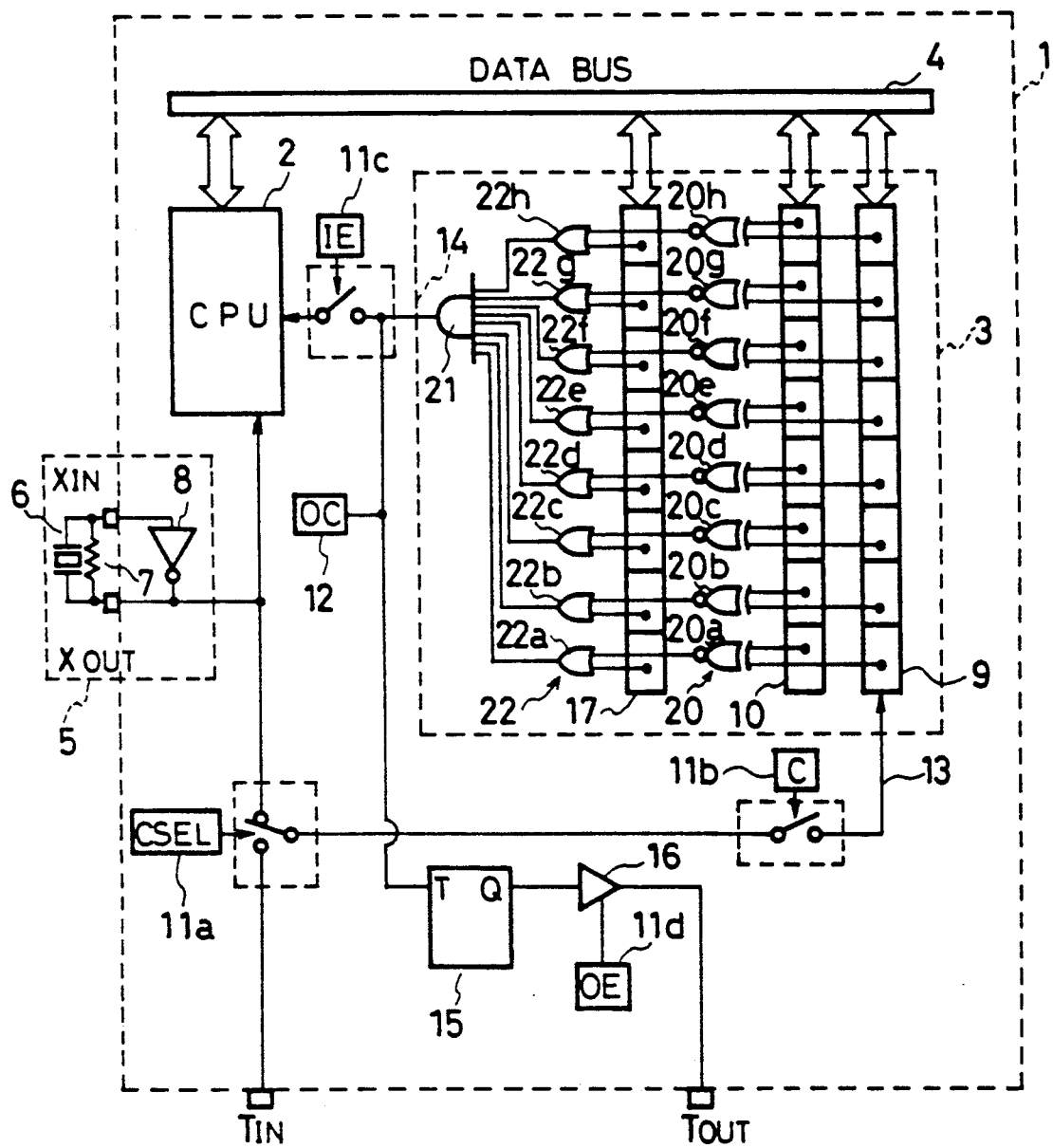
FIG. 1 is an illustration of an arrangement of a pulse generating apparatus according to an embodiment of the present invention.
Figure 3:
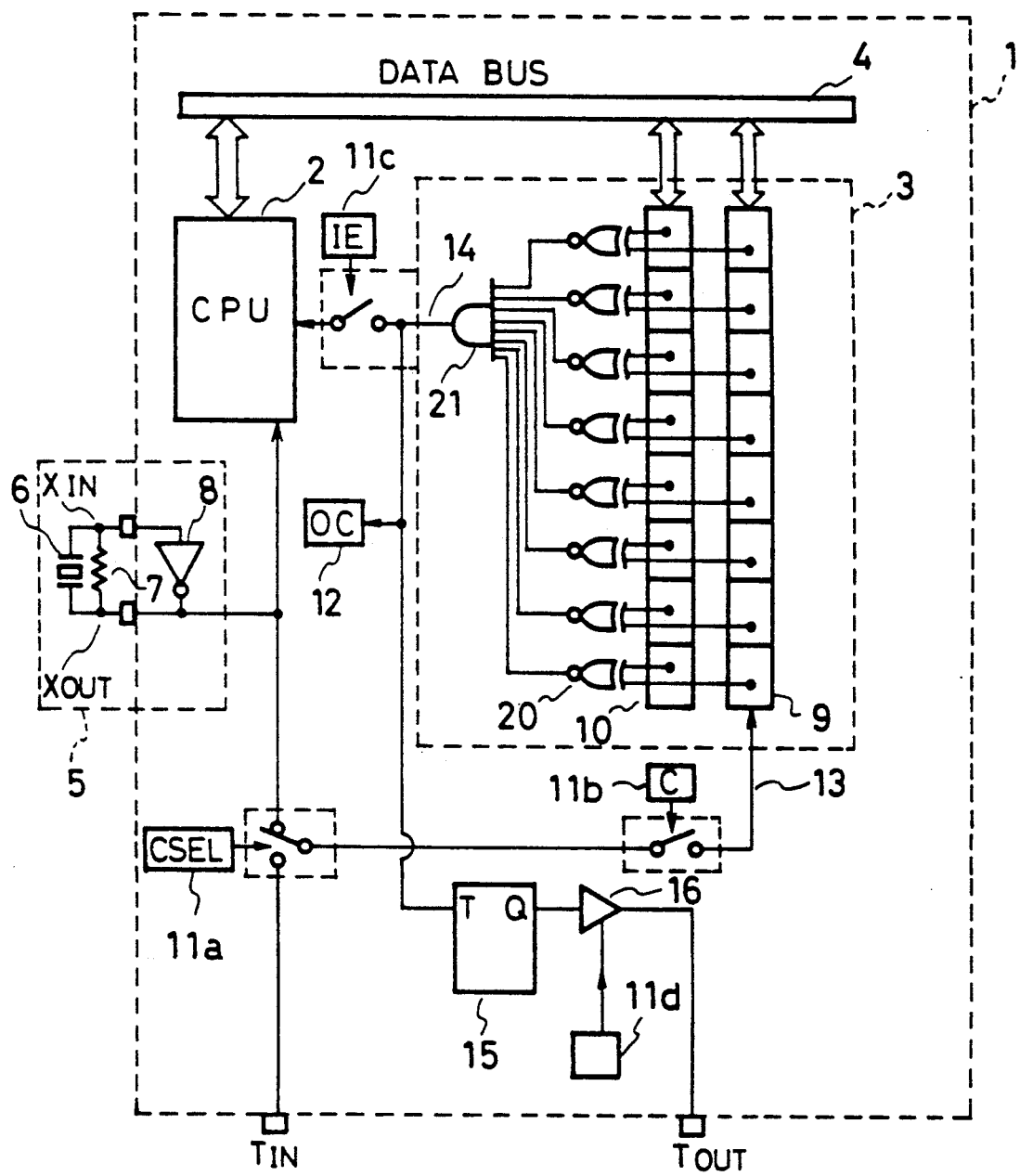
FIG. 3 is an illustration of an arrangement of a conventional pulse generating apparatus.

Different points of this invention with respect to the conventional example will be described hereinbelow with reference to FIG. 1. In FIG. 1, the arrangement of a microcomputer is the same as the FIG. 3 conventional arrangement except for the timer circuit 3. The newly provided mask register 17 is coupled to a data bus 4 and the initial values (H or L) of the respective bits of the mask register 17 are set by a CPU 2 through the bus 4. The bits of an 8-bit timer register 9 and an 8-bit comparing register 10 are compared with each other in comparing sections 20a to 20h of a first comparator 20, and the comparison results of all the comparing sections 20a to 20h are respectively inputted to input terminals of a second comparator 22 comprising an 8-bit OR circuit. The second comparator 22 performs the comparison between the bits of the mask register 17 and the first comparator 20 at the comparing sections 22a to 22h, so that the comparison results of all the comparing sections 22a to 22h are inputted to an 8-bit AND circuit 21 which acts as a coincidence detection circuit.

Each of the comparing sections 20a to 20h of the first comparator 20 outputs a H-signal only in response to the coincidence of two inputs, while each of the comparing sections 22a to 22h of the second comparator 22 outputs a H-signal when one of the two inputs is in the high-level state. The timer register 9 is constructed by a shift register so as to be shifted to the superordination at every count to keep the data. The first comparator 20 generates a coincidence output (EXNOR) in connection with the respective bits of the timer register 9 and the comparing register 10, and the second comparator 22 takes the logical sum (OR) with respect to the coincidence outputs and the respective bit values of the mask register 17. This logical sums are inputted to an 8-input logical product (AND) circuit, thereby obtaining a comparison output 14.

Secondly, a description will be made hereinbelow in terms of the operation. The CPU 2 operates in synchronism with a clock supplied from an oscillation circuit 5. In the timer circuit 3, a comparison value is set with the CPU 2 writing data into the comparing register 10. Subsequently, the initial value of the timer 3 is set with the CPU 2 writing data into the timer register 9. When the clock selection bit 11a is set to be "0" and the clock stopping bit 11b is set to be "1", the clock from the oscillation circuit 5 becomes the clock input signal 13, and the timer 3 starts counting up the clock input signal 13 so that the count value always appears at the timer register 9. The value of the timer register 9 and the value of the comparing register 10 are always compared with each other with respect to each bit at the respective comparing sections 20a to 20h. Now assuming that all the bits of the mask register 17 are set to the comparison-effective "0", the operation thereof is the same as the conventional timer. More specifically, in the case that all the bits of the timer register 9 and the comparing register 10 are coincident with each other, the comparison output 14 becomes "1". Thus, if the value of the comparing register 10 is set to become constant, the comparison output can be obtained one time at every period of the timer 3.

On the other hand, in the case that the subordinative 5 bits of the mask register 17 are set to the comparison-effective "0" and the remaining superordinative bits are set to the comparison-invalid "1", the respective bits of the timer register 9 and the comparing register 10 are coincident with each other within 5 bits (32 counts).

Further, if only the third bit from the least significant bit is set to the comparison-invalid "1", the comparison output 14 can be obtained two times at every period of the timer. One of the intervals of the comparison outputs 14 is longer and the other interval thereof is shorter.

Figure 2A:
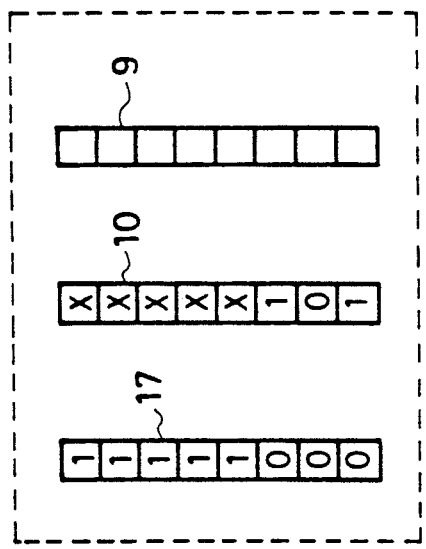
FIG. 2 is a timing chart for describing the operation of this invention.
Figure 2B:
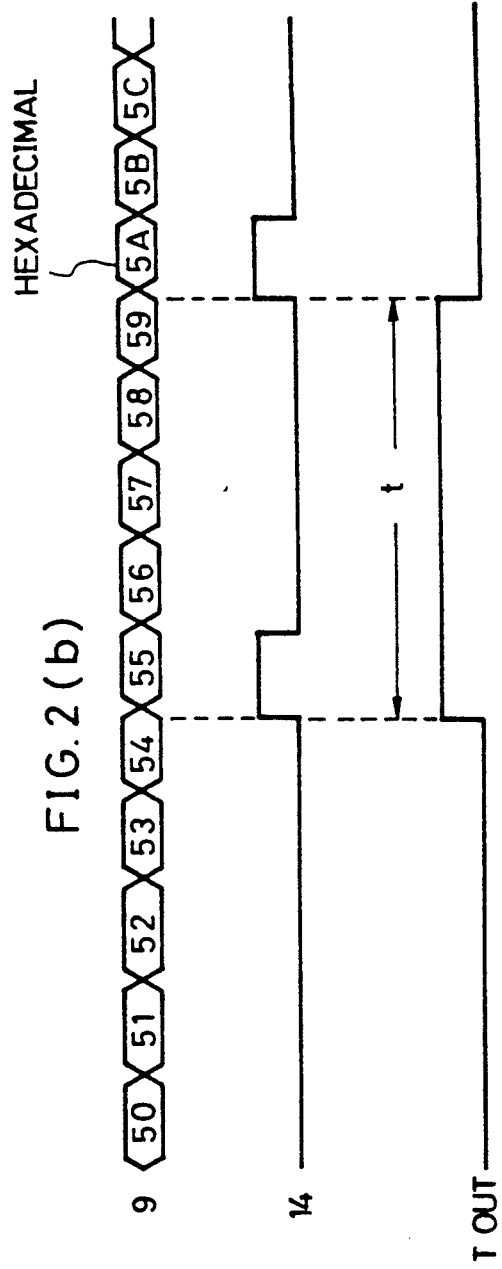

FIG. 2 is an illustration of timings in cases where the subordinative 3 bits of the mask register 17 are set to the comparison-effective "0", the superordinative 5 bits are set to the comparison-invalid "1" and the initial value "101" is set to the comparing register 10. That is, the timer register 9 counts "101"=5 clocks from the timer register 9="00000000" and the comparing sections 20a to 20c corresponding to the subordinative 3 bits of the first comparator 20 output "1". Thus, since the comparing sections 22a to 22c corresponding to the subordinative 3 bits of the second comparator 22 and the comparing sections 22d to 22h corresponding to the superordinative 8 bits thereof output "1", the comparison output 14 becomes "1". With the next 5 counts, the comparison output 14 again becomes "1" whereby the TOUT (pulse) can be kept to be in the high level (H) state at a series of rising intervals t.

As described above, according to this invention, the pulse generating apparatus is equipped with the central processing unit (CPU), the plural-bit timer register whose initial value is set by the CPU and which counts the clocks, the plural-bit comparing register whose reference value is set by the CPU, the first comparator for performing at every bit the comparison between the count value of the timer register and the reference value of the comparing register and the coincidence detection circuit responsive to the output value of the first comparator so as to output the coincidence signal when all the bits of the output values thereof are the same, and the pulse generating apparatus further comprises the plural-bit mask register and the second comparator for comparing, in terms of every bit, the comparison values of the mask register with the output values of the first comparator, the mask register and the second comparator being provided between the first comparator and the coincidence detection circuit. Accordingly, the generation timing of the coincidence output pulse can variously changed by one data setting operation to the mask register without changing the value of the comparing register, and hence it is possible to reduce the program execution load of the CPU concurrently with generating a short-interval waveform which is difficult by the conventional program processing.

What is claimed is:

1. A pulse generating apparatus equipped with a clocked central processing unit (CPU), a plural-bit timer register whose initial value is set by said CPU and which counts the clocks, a plural-bit comparing register whose reference value is set by said CPU, a plural output first comparator for performing at every bit a comparison between a count value of said timer register and the reference value of said comparing register, a plural-bit mask register whose value is set by said CPU, a second comparator having plural outputs for respectively choosing the compare bit from output values of said first comparator indicated by the values of said mask register, a coincidence detection circuit responsive to said plural outputs of said second comparator so as to output a coincidence signal when all bits of the input values thereof are the same, said mask register and said second comparator being provided between the first comparator and said coincidence detection circuit.

2. A pulse generating apparatus as claimed in claim 1, wherein said timer register is constructed by a plural-bit shift register, and said comparing register and said mask register are respectively constructed by ordinal type registers whose bit number is equal to that of said timer register.

* * * * *